United States Patent
Boulaknadal et al.

(10) Patent No.: US 10,812,069 B1
(45) Date of Patent: Oct. 20, 2020

(54) ISOLATED SWITCH DRIVING CIRCUIT

(71) Applicants: Youssef Boulaknadal, Houston, TX (US); Carlos Rivero, Katy, TX (US); Ryan Rocheleau, Houston, TX (US)

(72) Inventors: Youssef Boulaknadal, Houston, TX (US); Carlos Rivero, Katy, TX (US); Ryan Rocheleau, Houston, TX (US)

(73) Assignee: BAKER HUGHES, A GE COMPANY, LLC, Houston, TX (US)

( * ) Notice: Subject to any disclaimer, the term of this patent is extended or adjusted under 35 U.S.C. 154(b) by 0 days.

(21) Appl. No.: 16/532,746

(22) Filed: Aug. 6, 2019

(51) Int. Cl.
H03K 17/687 (2006.01)
E21B 4/04 (2006.01)
G01V 3/18 (2006.01)
H02M 3/156 (2006.01)

(52) U.S. Cl.
CPC ........... *H03K 17/6877* (2013.01); *E21B 4/04* (2013.01); *G01V 3/18* (2013.01); *H02M 3/156* (2013.01)

(58) Field of Classification Search
None
See application file for complete search history.

(56) References Cited

U.S. PATENT DOCUMENTS

| | | | |
|---|---|---|---|
| 4,438,356 A | 3/1984 | Fleischer | |
| 4,511,815 A | 4/1985 | Wood | |
| 4,748,351 A | 5/1988 | Barzegar | |
| 4,880,995 A | 11/1989 | Mori et al. | |
| 5,206,540 A | 4/1993 | De Sa E Silva et al. | |
| 5,550,412 A | 8/1996 | Anneser | |
| 5,686,854 A | 11/1997 | Smith | |
| 5,786,687 A * | 7/1998 | Faulk | H02M 3/155 323/289 |
| 5,909,138 A | 6/1999 | Stendahl | |
| 6,496,047 B1 | 12/2002 | Iskander et al. | |
| 8,063,671 B2 | 11/2011 | Xiao | |
| 8,971,002 B1 | 3/2015 | Lubicki et al. | |
| 9,966,837 B1 * | 5/2018 | Seaton | H02M 3/155 |
| 9,985,627 B2 * | 5/2018 | Hatano | H03K 17/165 |

FOREIGN PATENT DOCUMENTS

EP 1143619 B1 10/2001

* cited by examiner

*Primary Examiner* — Jeffery S Zweizig

(74) *Attorney, Agent, or Firm* — Cantor Colburn LLP

(57) ABSTRACT

A switch driving circuit includes an output coil having a first end and a second end and configured to receive positive or negative pulses from an input coil and a drive portion that includes a holding capacitor coupled across the output coil. The circuit also includes a discharge circuit that includes a discharge switch connected across the output coil, the discharge circuit having a discharge resistor and a discharge capacitor connected in parallel with each other and across control terminals of the discharge switch and a shunt circuit connected across the output coil that shorts the first end to the second end after a positive pulse is received.

14 Claims, 5 Drawing Sheets

ISOLATED SWITCH DRIVING CIRCUIT

BACKGROUND

1. Field of the Invention

The present invention generally relates to subsurface operations and more particularly to controlling solid state switches in a downhole environment.

2. Description of the Related Art

Boreholes are drilled deep into the earth for many applications such as carbon dioxide sequestration, geothermal production, and hydrocarbon exploration and production. In all of the applications, the boreholes are drilled such that they pass through or allow access to energy or a material (e.g., heat, a gas, or fluid) contained in a formation located below the earth's surface. Different types of tools and instruments may be disposed in the boreholes to perform various tasks and measurements.

At certain times large pulses of electrical energy (voltage/current) may need to be provided to various tools or instruments disposed in the borehole. For example, such a pulse can be needed by seismic device that utilizes a spark gap. Other examples exist.

When generating such pulses, or otherwise directing pulses from a single generator to and from multiple devices, one or more switches may need to be opened or closed. These switches can be of any type of solid state switch such as a MOSFET. In order to "open" or "close" the switches, a control or gate signal is required. It is often desirable to provide each switch with individual control signal for independent or electrically isolated operation.

A control unit such as a microcontroller, is often used to provide static control signal(s) to a buffer/driver and/or a digital isolator combination, which in turn provide the static individual switch control signal(s). The control unit and the isolator are typically connected to a low voltage power source, such as a 5V power source. One or more transformers, or DC to DC converter circuits, are typically used in applications that required differing voltage, or higher, voltage control signals.

To meet that above described needs, driving a single switch typically requires one transformer or DC to DC converter circuit, an isolator, a driver, or a combination of these elements. When more than one switch is required, a transformer-isolator-driver combination may also be required for each switch. As such, the size and complexity of circuits driving multiple switches increases.

SUMMARY

Disclosed herein is a circuit for driving a switch. The circuit includes: an output coil having a first end and a second end and configured to receive positive or negative pulses from an input coil; a drive portion that includes a holding capacitor coupled across the output coil; and a discharge circuit that includes a discharge switch connected across the output coil. The discharge circuit has a discharge resistor and a discharge capacitor connected in parallel with each other and across control terminals of the discharge switch and the discharge circuit provides a discharge path for the holding capacitor through the discharge switch and into the output coil when the discharge switch is closed. The circuit also includes a shunt circuit connected across the output coil that shorts the first end to the second end after a positive pulse is received.

Also disclosed is an assembly comprising: first, second, and third control switches. The first control switch controls current flow through a positive output line, the third control switch controls current flow through a negative output line, and the second control switch shunts the positive output line to the negative output line. The assembly also includes first, second, and third switch driver driving circuits. Each of the drive circuits are connected to the first, second, and third control switches, respectively, and includes: an output coil having a first end and a second end and configured to receive positive or negative pulses from an input coil; a drive portion that includes a holding capacitor coupled across the output coil; a discharge circuit that includes a discharge switch connected across the output coil. The discharge circuit has a discharge resistor and a discharge capacitor connected in parallel with each other and across control terminals of the discharge switch, the discharge circuit providing a discharge path for the holding capacitor through the discharge switch and into the output coil when the discharge switch is closed. The control switch also includes and a shunt circuit connected across the output coil that shorts the first end to the second end after a positive pulse is received.

BRIEF DESCRIPTION OF THE DRAWINGS

The foregoing and other features and advantages of the invention are described in conjunction with the accompanying figures.

Figure 1:
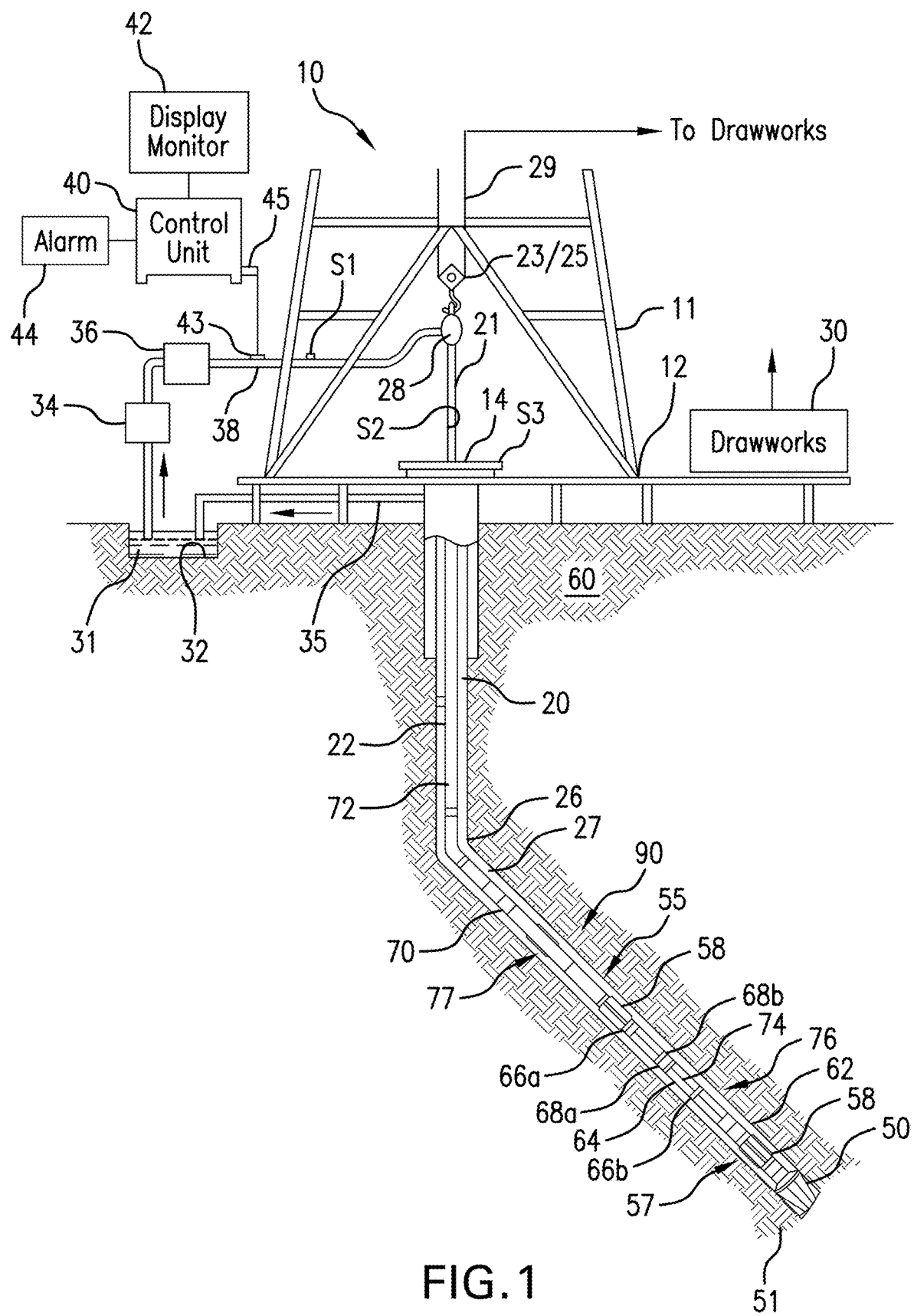
FIG. 1 is an example of a system for performing subsurface operations (e.g., downhole, within the earth or below other surface and into a formation) in which the driver circuit disclosed herein can be implemented.

Although FIG. 1 described herein provides a specific configuration for a drilling system, various other configurations are possible without departing from the scope of the present disclosure. That is, FIG. 1 and the description thereof is provided merely for illustrative and explanatory purposes, and is not intended to be limiting in any way.

Figure 2:
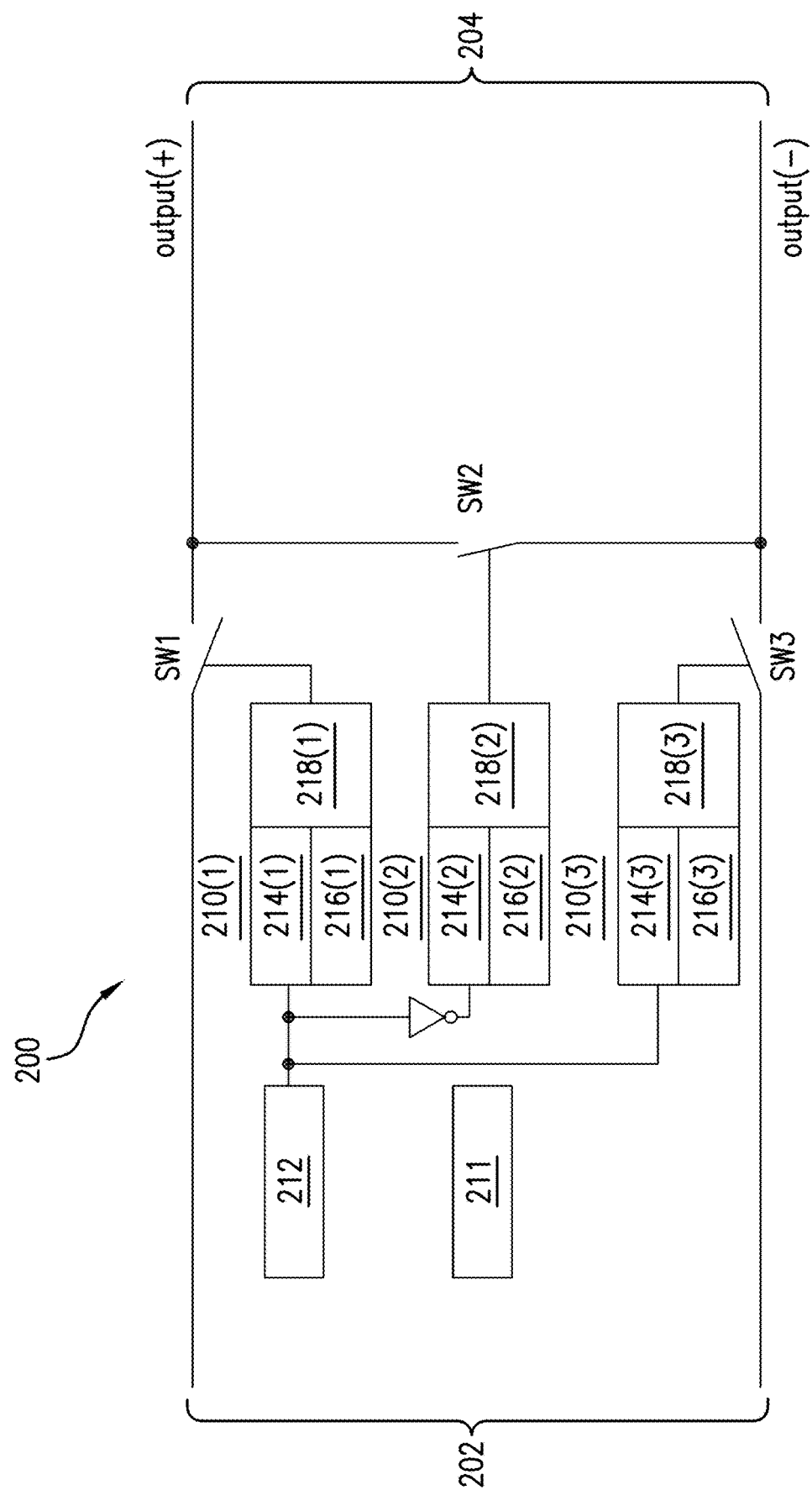
Figure 3:
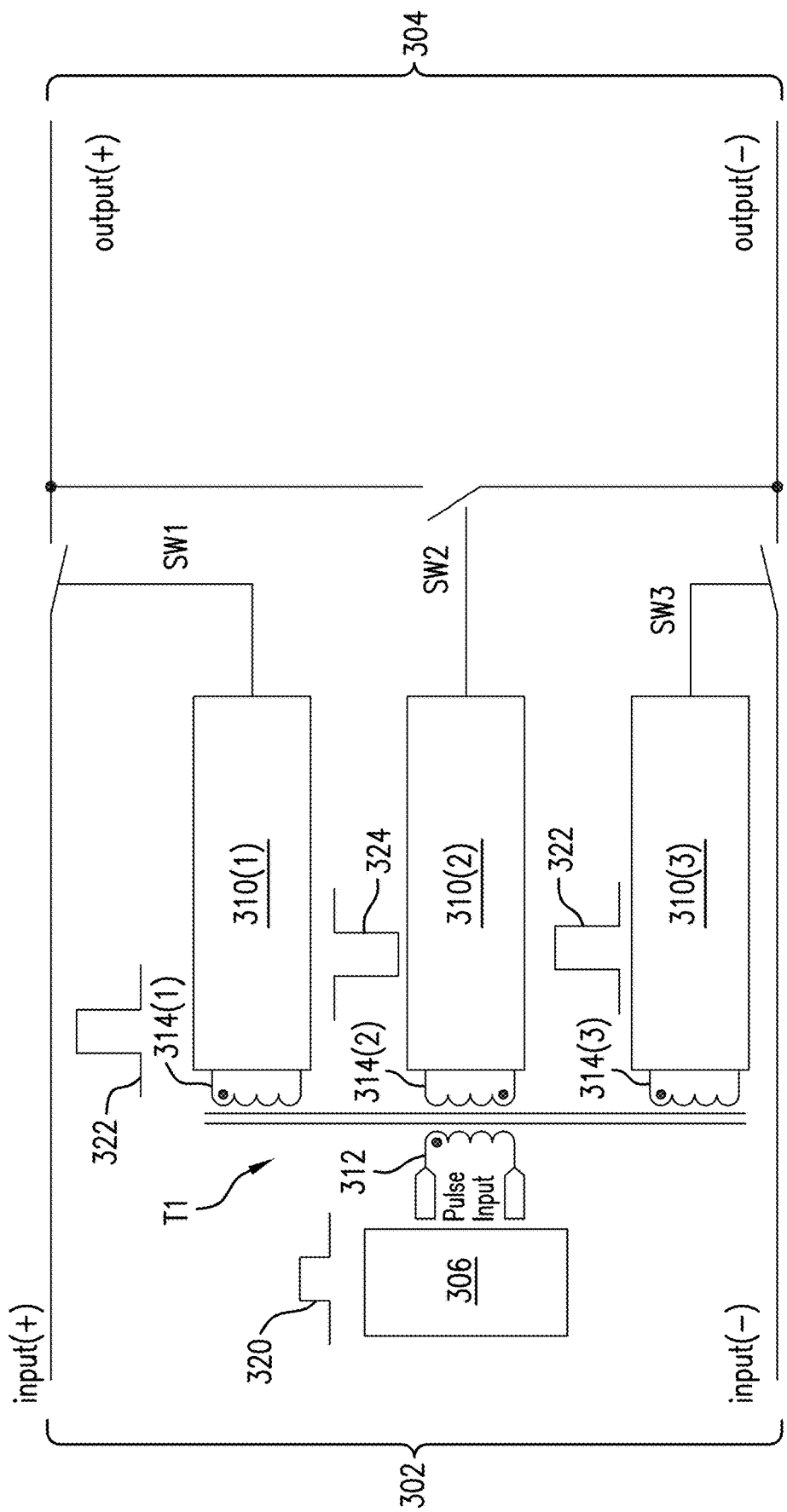
Figure 4:
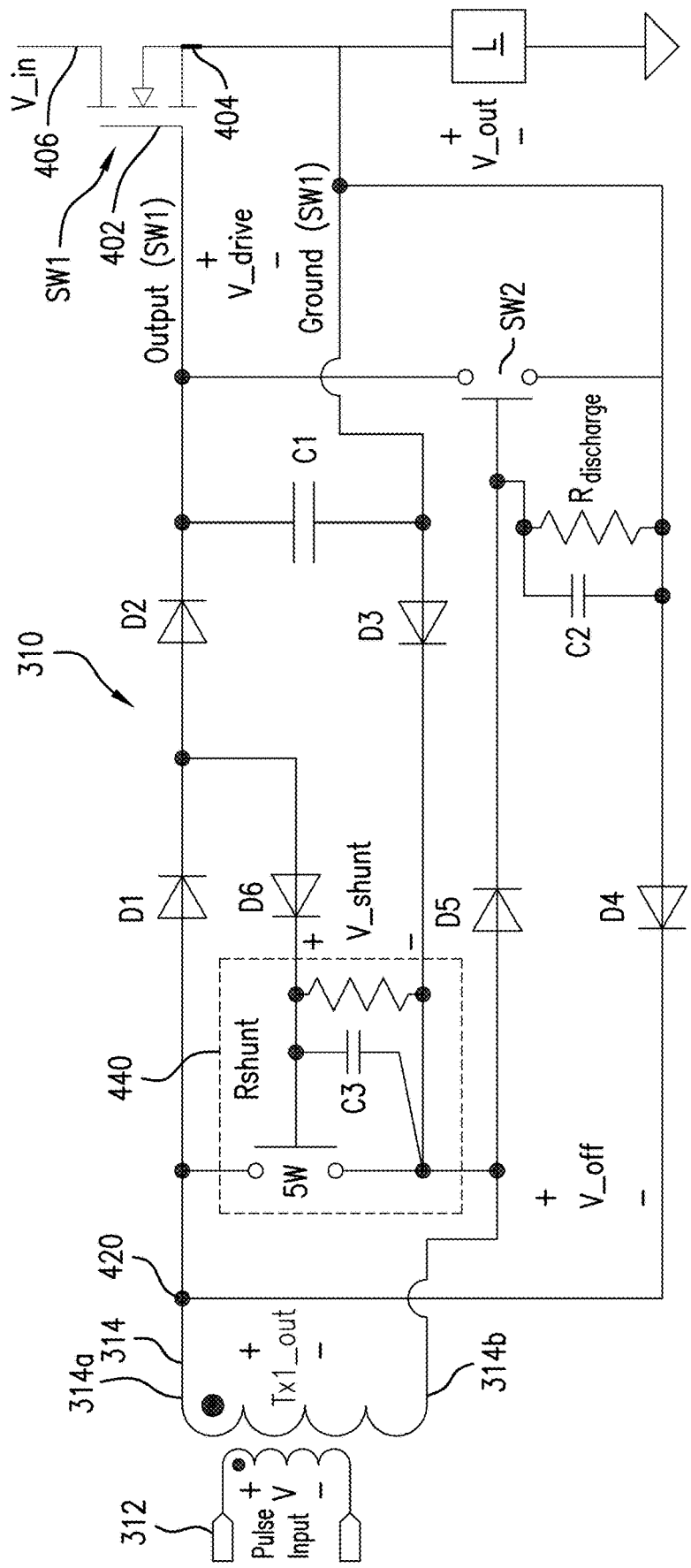
Figure 5:
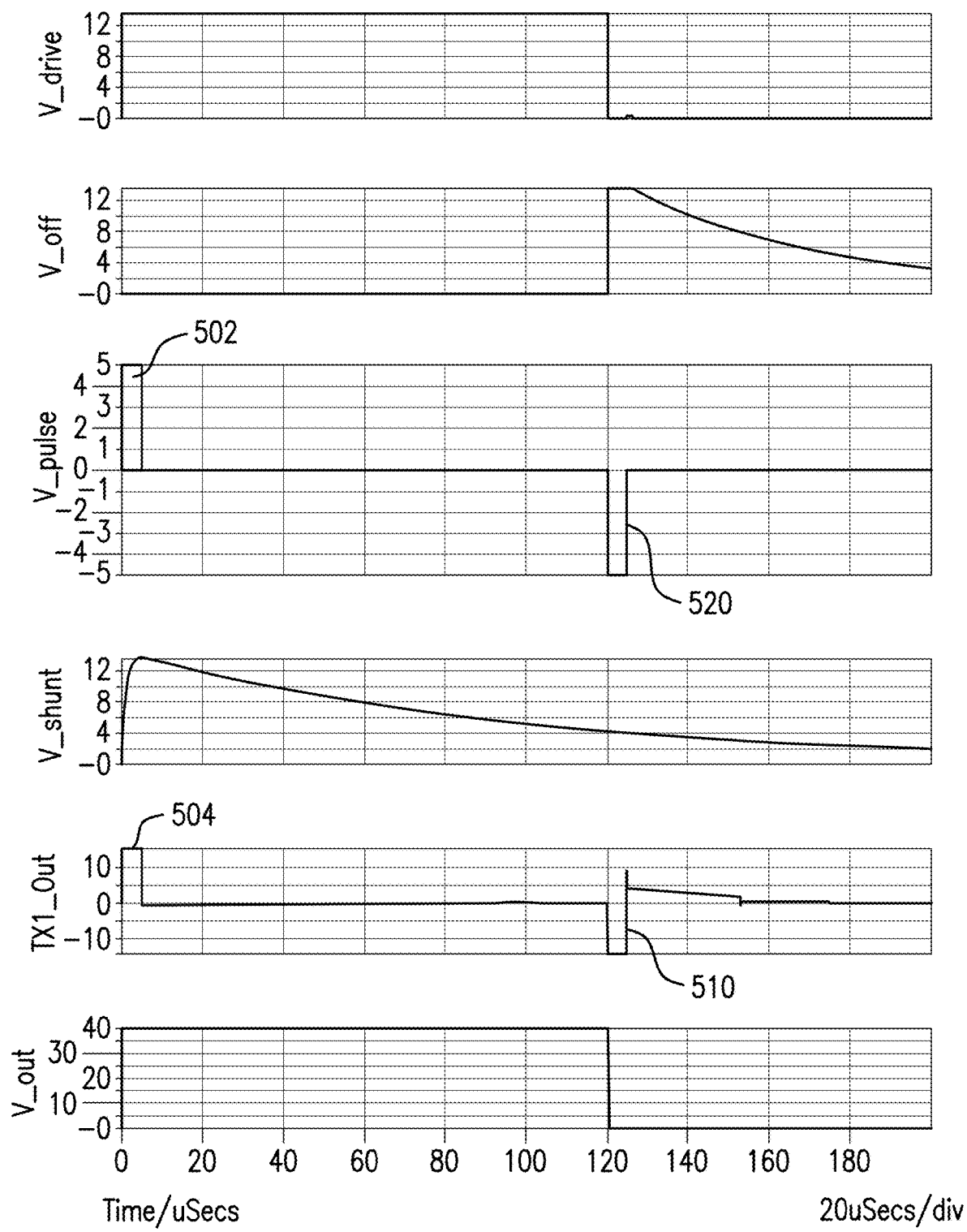

FIG. 2 is an example of a prior art system that includes a separate DC-to-DC converter for each switch used to form a pulse provided to an output thereof;

FIG. 3 is a circuit diagram that includes a driving circuit according to one embodiment;

FIG. 4 is circuit diagram of a circuit for driving a switch according to one embodiment; and FIG. 5 shows various voltages vs time of various locations in the circuit of FIG. 4.

DETAILED DESCRIPTION

Disclosed herein is isolated transformer driver circuit, turning multiple switches (e.g., solid state devices such as MOSFETs) on and off in a more simple manner than described in FIG. 2. As will be understood based on the teachings herein, the driver can achieve such switching while remaining isolated from the load output. In one embodiment, multiple voltage controlled switches can be turned off/on with one input voltage pulse. In such a system, the drive for the switch can be isolated from the input power stage.

With reference now to FIG. 1 a drilling system 10 that includes a drill string 20 having a drilling assembly 90, also referred to as a bottomhole assembly (BHA), conveyed in a borehole or borehole 26 penetrating an earth formation 60 is illustrated. The drilling system 10 includes a conventional derrick 11 erected on a floor 12 that supports a rotary table 14 that is rotated by a prime mover, such as an electric motor (not shown), at a desired rotational speed. The drill string 20 includes a drill pipe 22 or drilling tubular extending downward from the rotary table 14 into the borehole 26. A disintegrating device 50, such as a drill bit attached to the end of the drilling assembly 90, disintegrates the geological formations when it is rotated to drill the borehole 26. The drill string 20 is coupled to a drawworks 30 via a kelly joint 21, swivel 28, traveling block 25, and line 29 through a pulley 23. During the drilling operations, the drawworks 30 is operated to control the weight-on-bit (WOB), which affects the rate of penetration. The operation of the drawworks 30 is well known in the art and is thus not described in detail herein.

During drilling operations a suitable drilling fluid 31 (also referred to as the "mud") from a source or mud pit 32 is circulated under pressure through the drill string 20 by a mud pump 34. The drilling fluid 31 passes into the drill string 20 via a desurger 36, fluid line 38 and the kelly joint 21. Fluid line 38 may also be referred to as a mud supply line. The drilling fluid 31 is discharged at the borehole bottom 51 through an opening in the disintegrating device 50. The drilling fluid 31 circulates uphole through the annular space 27 between the drill string 20 and the borehole 26 and returns to the mud pit 32 via a return line 35. In some embodiments, an optional sensor S1 in the line 38 provides information about the fluid flow rate. In other embodiments, inlet flow rate may be calculated from a pump rate, and an outlet flow rate may be monitored by a sensor in the return line 35. A surface torque sensor S2 and a sensor S3 associated with the drill string 20 respectively provide information about the torque and the rotational speed of the drill string. Additionally, one or more sensors (not shown) associated with line 29 are used to provide the hook load of the drill string 20 and about other desired parameters relating to the drilling of the borehole 26. The system may further include one or more downhole sensors 70 located on the drill string 20 and/or the drilling assembly 90.

In some applications the disintegrating device 50 is rotated by rotating the drill pipe 22. However, in other applications, a drilling motor 55 (such as a mud motor) disposed in the drilling assembly 90 is used to rotate the disintegrating device 50 and/or to superimpose or supplement the rotation of the drill string 20. In either case, the rate of penetration (ROP) of the disintegrating device 50 into the formation 60 for a given formation and a drilling assembly largely depends upon the weight-on-bit and the rotational speed of the disintegrating device 50. In one aspect of the embodiment of FIG. 1, the drilling motor 55 is coupled to the disintegrating device 50 via a drive shaft (not shown) disposed in a bearing assembly 57. If a mud motor is employed as the drilling motor 55, the mud motor rotates the disintegrating device 50 when the drilling fluid 31 passes through the drilling motor 55 under pressure. The bearing assembly 57 supports the radial and axial forces of the disintegrating device 50, the downthrust of the drilling motor and the reactive upward loading from the applied weight-on-bit. Stabilizers 58 coupled to the bearing assembly 57 and at other suitable locations on the drill string 20 act as centralizers, for example for the lowermost portion of the drilling motor assembly and other such suitable locations.

A surface control unit 40 receives signals from the downhole sensors 70 and devices via a sensor 43 placed in the fluid line 38 as well as from sensors S1, S2, S3, hook load sensors, sensors to determine the height of the traveling block (block height sensors), and any other sensors used in the system and processes such signals according to programmed instructions provided to the surface control unit 40 (i.e., a surface unit). For example, a surface depth tracking system may be used that utilizes the block height measurement to determine a length of the borehole (also referred to as measured depth of the borehole) or the distance along the borehole from a reference point at the surface to a predefined location on the drill string 20, such as the disintegrating device 50 or any other suitable location on the drill string 20 (also referred to as measured depth of that location, e.g. measured depth of the disintegrating device 50). Determination of measured depth at a specific time may be accomplished by adding the measured block height to the sum of the lengths of all equipment that is already within the borehole at the time of the block-height measurement, such as, but not limited to drill pipes 22, drilling assembly 90, and disintegrating device 50. Depth correction algorithms may be applied to the measured depth to achieve more accurate depth information. Depth correction algorithms, for example, may account for length variations due to pipe stretch or compression due to temperature, weight-on-bit, borehole curvature and direction. By monitoring or repeatedly measuring block height, as well as lengths of equipment that is added to the drill string 20 while drilling deeper into the formation over time, pairs of time and depth information are created that allow estimation of the depth of the borehole 26 or any location on the drill string 20 at any given time during a monitoring period. Interpolation schemes may be used when depth information is required at a time between actual measurements. Such devices and techniques for monitoring depth information by a surface depth tracking system are known in the art and therefore are not described in detail herein.

The surface control unit 40 displays desired drilling parameters and other information on a display/monitor 42 for use by an operator at the rig site to control the drilling operations. The surface control unit 40 contains a computer that may comprise memory for storing data, computer programs, models and algorithms accessible to a processor in the computer, a recorder, such as tape unit, memory unit, etc. for recording data and other peripherals. The surface control unit 40 also may include simulation models for use by the computer to process data according to programmed instructions. The control unit responds to user commands entered through a suitable device, such as a keyboard. The control unit 40 can output certain information through an output device, such as a display, a printer, an acoustic output, etc., as will be appreciated by those of skill in the art. The control unit 40 is adapted to activate alarms 44 when certain unsafe or undesirable operating conditions occur.

The drilling assembly 90 may also contain other sensors and devices or tools for providing a variety of measurements relating to the formation 60 surrounding the borehole 26 and for drilling the borehole 26 along a desired path. Such devices may include a device for measuring formation properties, such as the formation resistivity or the formation gamma ray intensity around the borehole 26, near and/or in front of the disintegrating device 50 and devices for determining the inclination, azimuth and/or position of the drill string. A logging-while-drilling (LWD) device for measuring formation properties, such as a formation resistivity tool 64 or a gamma ray device 76 for measuring the formation gamma ray intensity, made according an embodiment described herein may be coupled to the drill string 20 including the drilling assembly 90 at any suitable location.

For example, coupling can be above a lower kick-off subassembly 62 for estimating or determining the resistivity of the formation 60 around the drill string 20 including the drilling assembly 90. Another location may be near or in front of the disintegrating device 50, or at other suitable locations. A directional survey tool 74 that may comprise means to determine the direction of the drilling assembly 90 with respect to a reference direction (e.g., magnetic north, vertical up or down direction, etc.), such as a magnetometer, gravimeter/accelerometer, gyroscope, etc. may be suitably placed for determining the direction of the drilling assembly, such as the inclination, the azimuth, and/or the toolface of the drilling assembly. Any suitable direction survey tool may be utilized. For example, the directional survey tool 74 may utilize a gravimeter, a magnetometer, or a gyroscopic device to determine the drill string direction (e.g., inclination, azimuth, and/or toolface). Such devices are known in the art and therefore are not described in detail herein.

In the above-described example configuration, the drilling motor 55 transfers power to the disintegrating device 50 via a shaft (not shown), such as a hollow shaft, that also enables the drilling fluid 31 to pass from the drilling motor 55 to the disintegrating device 50. In alternative embodiments, one or more of the parts described above may appear in a different order, or may be omitted from the equipment described above.

Still referring to FIG. 1, other LWD devices (generally denoted herein by numeral 77), such as devices for measuring rock properties or fluid properties, such as, but not limited to, porosity, permeability, density, salt saturation, viscosity, permittivity, sound speed, etc. may be placed at suitable locations in the drilling assembly 90 for providing information useful for evaluating the subsurface formations 60 or fluids along borehole 26. Such devices may include, but are not limited to, acoustic or seismic tools, nuclear tools, nuclear magnetic resonance tools, permittivity tools, and formation testing and sampling tools.

Still referring to FIG. 1, a resistivity tool 64 may be provided that includes, for example, a plurality of antennas including, for example, transmitters 66a or 66b or and receivers 68a or 68b. Resistivity can be one formation property that is of interest in making drilling decisions. Those of skill in the art will appreciate that other formation property tools can be employed with or in place of the resistivity tool 64.

Any or all of the above tools can receive power from the surface or from another location such as a generator in the BHA 110. Within the BHA or at other location, low-power power supplies to drive circuits and the like can be provided that provide, for example, a 5V supply voltage that can be used to drive logic or other circuits.

As shown in FIG. 2, a schematic illustration of a conventional circuit for providing isolated control signals (e.g., gate drive signals) to control the opening/closing of three switches: SW1, SW2, and SW3. These switches also appear in embodiments of the present invention.

The circuit 200 includes an input 202 and an output 204. The input 202 can be connected to a power source in a downhole tool, or the surface.

The switches, SW1 and SW3, connect pulses from an input 202 power source to the output 204. The switch, SW2, acts as a shunt, dissipating power between the positive and negative outputs, output(+) and output(−) 204. For example in one state (not shown), SW1 and SW3 are closed and SW2 is open, allowing power to pass from the input 202 to the output 204. Alternatively, in a second state, SW1 and SW3 are open, and SW2 is closed, disconnecting the input 202 from the output 204, and actively dissipating any power at the output 204.

Each switch is controlled by a driving circuit 210. As illustrated, SW1 is driven by driving circuit 210(1), SW2 is driven by driving circuit 210(2), and SW3 is driven by driving circuit 210(3).

In order for the driving circuits 210 to provide isolated control signals to the switches, SW1, SW2, and SW3, each driving circuit is typically connected to a low voltage power source 211 that provides, for example, a 5V supply.

A control circuit 212 provides control signals to the driving circuits 210. As illustrated, the control signals for driving circuits 210(1) and 210(3) are the same. The control signal for driving circuit 210(2) passes through an inverter, indicating that SW2 operates in a manner opposite to SW1 and SW3. To ensure that that the control signals 210 and power supply 211 are electrically isolated from the input 202 and output 204, the control signals pass through digital isolators, 214(1), 214(2), 214(3). The output of the digital isolators 214 are provided to the respective switch drivers 218(1), 218(2), and 218(3). Other terms for a switch driver include gate drivers, FET drivers, or buffer drivers.

The switches SW1, SW2, and SW3 may require higher voltage/current than that provided by the power source 211, for example, 12V to 15V. As such, each switch driver 218 requires a higher voltage/current than that provided by the low voltage power source 211. A transformer or a DC to DC converter is provided for each switch driver 218 as indicated by converters 216(1), 216(2), and 216(3). Such a system may work suitably in some situations; however, there is a significant amount of replication both in components and in cost.

In one embodiment disclosed herein, is a circuit that opens/closes one or more voltage controlled switches, such as MOSFETs, with one input voltage pulse. The circuit disclosed herein may, in one or more embodiments, isolate the drive for the switch from the input power supply. In a particular non-limiting embodiment, the circuit can have capacitive isolation of less than 5 pF.

FIG. 3 is one embodiment of switch control circuit 300 that can generate and maintain a control signals to multiple switches. The circuit 300 includes an input 302 and an output 304. A switch controller in the form a pulse generator 306 controls the operation of three separate switch drivers 310(1), 310(2), and 310(3). Herein, for all other elements that include a number in between parenthesis, the number can refer to whether the element is a "first", "second" or "third," etc. For example, the switch drivers 310 above can be first switch driver 310(1), second switch driver 310(2), and third switch driver 310(3).

The pulse generator 302 is coupled to the switch drivers 310 by a transformer generally shown as T1. The switch control circuit 300 can turn on (close) a switch (e.g., a solid state switch) with a positive pulse, and turn off the switch (open) with a negative pulse. The circuit reduces the bulkiness the driving circuits 210 required in the circuit of FIG. 2.

As illustrated, T1 includes an input coil 312 and three output coils 314(1), 314(2) and 314(3).

The polarity dots show that applying a positive pulse 320 on the input coil 312 will result in a positive pulse 322 on the first and third output coils 314(1) and 314(3), and an output negative pulse 324 on the second output coil 314(2).

Conversely, applying a negative (opposite polarity) pulse on the input coil 312 will result in opposite polarity pulses on the output coils 314(1), 314(2), and 314(3).

The relative magnitude any input pulse to the output pulse is controlled by the turns ratio between the input coil 312 and the output coils 314(1), 314(2), and 314(3). In one embodiment, the turns ratio is 1:3. In such an embodiment, the input pulse 320 could have, for example, a 5V magnitude, and the output positive pulse 322 could have a 15V magnitude.

As shown, the first switch driver 310(1) drives SW1, the second switch driver 310(2) drives SW2, and the third switch driver 310(3) drives SW3, which are arranged in the same manner as the switches shown in FIG. 2. The application of a positive pulse 320 will cause the output of switch drivers 310(1), 310(3) to drive a gate or other control input of a switch to approximately the same peak amplitude of the output positive pulse. The positive pulse 320 will cause the output of switch driver 310(2) to drive its gate or other control input of a switch to a low voltage level, opposite that of switch drivers 310(1) and 310(3). This level can be maintained indefinitely, as described in the following sections.

Should the switch driver 310(1), 310(2), and 310(3) output voltage decay, or drop, additional pulses can be provided, effectively refreshing the output (current switch state).

To connect or disconnect the input 302 from the outputs 304, an opposite polarity pulse is provided on the input coil 312. This will cause SW1 and SW3 to open and SW2 to close, or vice-versa.

In the example shown in FIG. 3, a single pulse 320 can cause three switches to change state, allowing the circuit to change between two different modes, connecting or disconnecting the input 302 from the output 304. Other numbers and combinations of switches and possible circuit states are within the scope of this invention.

With reference now to FIG. 4, operation of one embodiment of a switch driver 310 is discussed. Signals and voltages referred to in the description of FIG. 4 are illustrated in FIG. 5. The following description references both figures.

A positive pulse 502 to the input coil 312 is shown in the V_pulse vs Time graph on FIG. 5. The switch driver 310 is configured such that when such a positive pulse 502 is provided on the input coil 312, a positive pulse 504 is created across the output coil 314 (TX1_Out). This pulse is given reference numeral 504 in the TX1_Out vs. time graph of FIG. 5. The pulse 504 will cause the voltage across the control terminals switch SW1 to rise as shown in the V_drive vs Time graph of FIG. 5. As illustrated, SW1 is an enhancement mode N-channel MOSFET, but other types of switching devices could be used. In the illustrated embodiment, switch driver 310 has an output terminal Output SW1 and a ground terminal Ground SW1.

As shown, the gate of SW1 is connected through diodes D1 and D2 to a first end 314a of the output coil 314 and the source of SW1 is connected through diode D3 to the second end 314b of the output coil.

V_drive is maintained at a drive voltage level (about 15V as illustrated) by holding capacitor C1, connected across control terminals of SW1, the gate 402 and the source 404. As long as V_drive exceeds the threshold voltage to turn on (close) SW1, SW1 will pass current from its drain 406 to the source 404, and to load L.

Herein, it is assumed that V in (connected the drain 406 of SW1) is higher than the peak voltage of Tx1_out. For illustrative purposes, 40V is assumed, but any higher voltage would be suitable. The load L (V_out) will see approximately 40V when SW1 is closed. This is shown in the V_out vs Time graph of FIG. 5. The particular connection to the load L shown in FIG. 4 is not limiting and is illustrated to show that closing SW1 allows for current flow from its drain to its source.

SW2 is illustrated as a push-button or generic switch; however, similarly to SW1, it may be an N-channel MOSFET or other device. The control terminals of SW2 may be referred to as a gate and drain herein, but different names could be applied if SW2 is implemented as a different type of switch.

The voltage, V_off, is maintained by the holding capacitor C2 and slowly decays due to $R_{discharge}$. As shown, C2 and $R_{discharge}$ are connected in parallel and across the gate/source terminals of SW2. When discharged, the switch driver 310 has returned to the initial or ready state. A diode D5 is connected between the second end 314b and the control terminal (e.g., gate) of SW2 to ensure that the discharge is not travelling through the coil.

The current path for a discharge of C1 is through SW2, is through diode D4 and back in the output coil 314.

To open SW1, the holding capacitor C1 must be discharged. To discharge C1, a discharge circuit is shown in FIG. 4, including switch SW2. When a negative pulse 520 is applied to input coil 312, the output coil 314 produces pulse 510. This causes current to flow through D5, charging C2, and resulting on the voltage shown in V_off vs Time in FIG. 5. When the control voltage (V_off) rises, SW2 closes, and allows C1 to discharge.

The switch driver 310 also includes a shunt circuit 440. The shunt circuit 440 shorts the terminals of the output coil 314 by closing shunt switch SW3 shortly after V_pulse 502 is provided, when V_shunt rises above the turn on voltage of SW3. This short will keep a negative voltage, resulting from the magnetizing current discharge, from being created across the output coil 314 when the pulse 502 returns to zero. The shunt circuit 330 includes a shunt circuit holding capacitor C3 and a shunt discharge resistor Rshunt connected in parallel and across the control terminals of SW3. As shown in FIG. 5, C3 is and allowed to decay through $R_{shunt}$. D3 blocks current flow of the negative pulse 510 to C1, but allows it to charge during the positive pulse 504. As shown, the gate of SW3 is connected to one side (or a first side) of the output coil 314 through diodes D1 and D6. D6 is connected between D1 and D2.

Set forth below are some embodiments of the foregoing disclosure:

Embodiment 1

A circuit for driving a switch, the circuit comprising: an output coil having a first end and a second end and configured to receive positive or negative pulses from an input coil; a drive portion that includes a holding capacitor coupled across the output coil; a discharge circuit that includes a discharge switch connected across the output coil, the discharge circuit having a discharge resistor and discharge capacitor connected in parallel with each other and across control terminals of the discharge switch, the discharge circuit providing a discharge path for the holding capacitor through the discharge switch and into the output coil when the discharge switch is closed; and a shunt circuit connected across the output coil that shorts the first end to the second end after a positive pulse is received.

Embodiment 2

The circuit of any prior embodiment, further comprising: a first and second diode connected in series between the first end and the holding capacitor.

Embodiment 3

The circuit of any prior embodiment, further comprising: a third diode connected in series between the holding capacitor and the second end.

Embodiment 4

The circuit of any prior embodiment, wherein the holding capacitor is charged when a positive pulse is received at the output coil and the discharge switch closes when a negative pulse is received at the output coil.

Embodiment 5

The circuit of any prior embodiment, wherein the holding capacitor is charged when a negative pulse is received and the discharge switch closes when a positive pulse is received at the output coil.

Embodiment 6

The circuit of any prior embodiment, wherein the second end is connected to a gate of the discharge switch and the first end is connected to the source of the discharge switch.

Embodiment 7

The circuit of any prior embodiment, wherein a diode is connected between the second end and the gate.

Embodiment 8

The circuit of any prior embodiment, wherein the first end is connected to a gate of the shunt switch and the second end is connected to the source of the shunt switch.

Embodiment 9

The circuit of any prior embodiment, wherein a first diode and sixth diode are connected between the first end and the gate.

Embodiment 10

An assembly comprising: first, second and third control switches, wherein the first control switch controls current flow through a positive output line, the third control switch controls current flow through a negative output line, and the second control switch shunts the positive output line to the negative output line; first, second and third switch driver driving circuits, each switch driving circuit being connected to a respective one of the first, second and third control switches, each switch driving circuit including: an output coil having a first end and a second end and configured to receive positive or negative pulses from an input coil; a drive portion that includes a holding capacitor coupled across the output coil; a discharge circuit that includes a discharge switch connected across the output coil, the discharge circuit having a discharge resistor and discharge capacitor connected in parallel with each other and across control termi-nals of the discharge switch, the discharge circuit providing a discharge path for the holding capacitor through the discharge switch and into the output coil when the discharge switch is closed; and a shunt circuit connected across the output coil that shorts the first end to the second end after a positive pulse is received.

Embodiment 11

The assembly of any prior embodiment, wherein each switch driving circuit further includes: a first and second diode connected in series between the first end and the holding capacitor.

Embodiment 12

The assembly of any prior embodiment, wherein each switch driving circuit further includes: a third diode connected in series between the holding capacitor and the second end.

Embodiment 13

The assembly of any prior embodiment, wherein the holding capacitor of the first and third switch driving circuits is charged when a positive pulse is received at a respective output coil and the discharge switch of the first and third switch driving circuits closes when a negative pulse is received at a respective output coil.

Embodiment 14

The assembly of any prior embodiment, wherein the holding capacitor of the second switch driving circuit is charged when a negative pulse is received at a respective output coil and the discharge switch of the second switch driving circuit closes when a positive pulse is received at a respective output coil.

In support of the teachings herein, various analysis components may be used including a digital and/or an analog system. For example, controllers, computer processing systems. The systems may have components such as processors, storage media, memory, inputs, outputs, communications links (e.g., wired, wireless, optical, or other), user interfaces, software programs, signal processors (e.g., digital or analog) and other such components (e.g., such as resistors, capacitors, inductors, and others) to provide for operation and analyses of the apparatus and methods disclosed herein in any of several manners. It is these invention(s) may be, but need not be, implemented in conjunction with a set of computer executable instructions stored on a non-transitory computer readable medium, including memory (e.g., ROMs, RAMs), optical (e.g., CD-ROMs), or magnetic (e.g., disks, hard drives), or any other type that when executed causes a computer to implement the methods and/or processes described herein. These instructions may provide for equipment operation, control, data collection, analysis and other functions deemed relevant by a system designer, owner, user, or other such personnel, in addition to the functions described in this disclosure. Processed data, such as a result of an implemented method, may be transmitted as a signal via a processor output interface to a signal receiving device. The signal receiving device may be a display monitor or printer for presenting the result to a user. Alternatively or in addition, the signal receiving device may be memory or a storage medium. It will be appreciated that storing the result in memory or the storage medium may transform the memory or storage medium into a new state (i.e., containing the result) from a prior state (i.e., not containing the result). Further, in some embodiments, an alert signal may be transmitted from the processor to a user interface if the result exceeds a threshold value.

Furthermore, various other components may be included and called upon for providing for aspects of the teachings herein. For example, a sensor, transmitter, receiver, transceiver, antenna, controller, optical unit, electrical unit, and/ or electromechanical unit may be included in support of the various aspects discussed herein or in support of other functions beyond this disclosure.

The use of the terms "a" and "an" and "the" and similar referents in the context of describing the invention (especially in the context of the following claims) are to be construed to cover both the singular and the plural, unless otherwise indicated herein or clearly contradicted by context. Further, it should further be noted that the terms "first," "second," and the like herein do not denote any order, quantity, or importance, but rather are used to distinguish one element from another. The modifier "about" or "substantially" used in connection with a quantity is inclusive of the stated value and has the meaning dictated by the context (e.g., it includes the degree of error associated with measurement of the particular quantity). For example, the phrase "substantially constant" is inclusive of minor deviations with respect to a fixed value or direction, as will be readily appreciated by those of skill in the art.

The flow diagram(s) depicted herein is just an example. There may be many variations to this diagram or the steps (or operations) described therein without departing from the scope of the present disclosure. For instance, the steps may be performed in a differing order, or steps may be added, deleted or modified. All of these variations are considered a part of the present disclosure.

It will be recognized that the various components or technologies may provide certain necessary or beneficial functionality or features. Accordingly, these functions and features as may be needed in support of the appended claims and variations thereof, are recognized as being inherently included as a part of the teachings herein and a part of the present disclosure.

The teachings of the present disclosure may be used in a variety of well operations. These operations may involve using one or more treatment agents to treat a formation, the fluids resident in a formation, a borehole, and/or equipment in the borehole, such as production tubing. The treatment agents may be in the form of liquids, gases, solids, semi-solids, and mixtures thereof. Illustrative treatment agents include, but are not limited to, fracturing fluids, acids, steam, water, brine, anti-corrosion agents, cement, permeability modifiers, drilling fluids, emulsifiers, demulsifiers, tracers, flow improvers etc. Illustrative well operations include, but are not limited to, hydraulic fracturing, stimulation, tracer injection, cleaning, acidizing, steam injection, water flooding, cementing, etc.

While embodiments described herein have been described with reference to various embodiments, it will be understood that various changes may be made and equivalents may be substituted for elements thereof without departing from the scope of the present disclosure. In addition, many modifications will be appreciated to adapt a particular instrument, situation, or material to the teachings of the present disclosure without departing from the scope thereof. Therefore, it is intended that the disclosure not be limited to the particular embodiments disclosed as the best mode contemplated for carrying the described features, but that the present disclosure will include all embodiments falling within the scope of the appended claims.

Accordingly, embodiments of the present disclosure are not to be seen as limited by the foregoing description, but are only limited by the scope of the appended claims.

What is claimed is:

1. A circuit for driving a switch, the circuit comprising:
   an output coil having a first end and a second end and configured to receive positive or negative pulses from an input coil;
   a drive portion that includes a holding capacitor coupled across the output coil;
   a discharge circuit that includes a discharge switch connected across the output coil, the discharge circuit having a discharge resistor and a discharge capacitor connected in parallel with each other and across control terminals of the discharge switch, the discharge circuit providing a discharge path for the holding capacitor through the discharge switch and into the output coil when the discharge switch is closed; and
   a shunt circuit connected across the output coil that shorts the first end to the second end after a positive pulse is received.

2. The circuit of claim 1, further comprising:
   a first and second diode connected in series between the first end and the holding capacitor.

3. The circuit of claim 1, further comprising:
   a third diode connected in series between the holding capacitor and the second end.

4. The circuit of claim 1, wherein the holding capacitor is charged when a positive pulse is received at the output coil and the discharge switch closes when a negative pulse is received at the output coil.

5. The circuit of claim 1, wherein the holding capacitor is charged when a negative pulse is received and the discharge switch closes when a positive pulse is received at the output coil.

6. The circuit of claim 1, wherein the second end is connected to a gate of the discharge switch and the first end is connected to the source of the discharge switch.

7. The circuit of claim 6, wherein a diode is connected between the second end and the gate.

8. The circuit of claim 1, wherein the first end is connected to a gate of the shunt switch and the second end is connected to the source of the shunt switch.

9. The circuit of claim 8, wherein a first diode and sixth diode are connected between the first end and the gate.

10. An assembly comprising:
    first, second and third control switches, wherein the first control switch controls current flow through a positive output line, the third control switch controls current flow through a negative output line, and the second control switch shunts the positive output line to the negative output line;
    first, second and third switch driver driving circuits, each switch driving circuit being connected to a respective one of the first, second and third control switches, each switch driving circuit including:
       an output coil having a first end and a second end and configured to receive positive or negative pulses from an input coil;
       a drive portion that includes a holding capacitor coupled across the output coil;
       a discharge circuit that includes a discharge switch connected across the output coil, the discharge circuit having a discharge resistor and discharge capacitor connected in parallel with each other and across control terminals of the discharge switch, the discharge circuit providing a discharge path for the holding capacitor through the discharge switch and into the output coil when the discharge switch is closed; and a shunt circuit connected across the output coil that shorts the first end to the second end after a positive pulse is received.

11. The assembly of claim 10, wherein each switch driving circuit further includes: a first and second diode connected in series between the first end and the holding capacitor.

12. The assembly of claim 11, wherein each switch driving circuit further includes: a third diode connected in series between the holding capacitor and the second end.

13. The assembly of claim 10, wherein the holding capacitor of the first and third switch driving circuits is charged when a positive pulse is received at a respective output coil and the discharge switch of the first and third switch driving circuits closes when a negative pulse is received at a respective output coil.

14. The assembly of claim 13, wherein the holding capacitor of the second switch driving circuit is charged when a negative pulse is received at a respective output coil and the discharge switch of the second switch driving circuit closes when a positive pulse is received at a respective output coil.

* * * * *